(12) United States Patent
Lai et al.

(10) Patent No.: US 11,740,300 B2
(45) Date of Patent: Aug. 29, 2023

(54) SHORT CIRCUIT DETECTION APPARATUS AND CONTROL METHOD FOR SWITCHED CAPACITOR CONVERTER

(71) Applicant: Halo Microelectronics International, Campbell, CA (US)

(72) Inventors: Suming Lai, San Diego, CA (US); Kenneth Chung-Yin Kwok, Irvine, CA (US); Kien Chan Vi, Palo Alto, CA (US)

(73) Assignee: Halo Microelectronics International, Campbell, CA (US)

( * ) Notice: Subject to any disclaimer, the term of this patent is extended or adjusted under 35 U.S.C. 154(b) by 69 days.

(21) Appl. No.: 17/484,269

(22) Filed: Sep. 24, 2021

(65) Prior Publication Data

US 2022/0128632 A1  Apr. 28, 2022

Related U.S. Application Data

(60) Provisional application No. 63/106,669, filed on Oct. 28, 2020.

(51) Int. Cl.
*G01R 31/52* (2020.01)
*H02M 1/08* (2006.01)
*H02M 3/07* (2006.01)

(52) U.S. Cl.
CPC .............. *G01R 31/52* (2020.01); *H02M 1/08* (2013.01); *H02M 3/07* (2013.01)

(58) Field of Classification Search
CPC ............ G01R 31/52; H02M 1/08; H02M 3/07
See application file for complete search history.

(56) References Cited

U.S. PATENT DOCUMENTS

| | | | | |
|---|---|---|---|---|
| 2004/0140792 | A1* | 7/2004 | Abdoulin | H02M 1/44 323/282 |
| 2010/0181946 | A1* | 7/2010 | Ogasawara | H02M 1/32 318/139 |
| 2011/0080149 | A1* | 4/2011 | Fukuta | H02M 1/36 323/284 |
| 2017/0322248 | A1* | 11/2017 | Miret | G01R 31/52 |
| 2017/0338735 | A1* | 11/2017 | Alarcon-Cot | H02M 1/4225 |

* cited by examiner

*Primary Examiner* — Alexander Satanovsky
*Assistant Examiner* — Sharah Zaab
(74) *Attorney, Agent, or Firm* — Li Li; AP3 Law Firm PLLC (57) ABSTRACT

A method includes connecting an input voltage bus of a switched capacitor converter to a power source through a load switch, in a first short circuit testing step, determining whether the load switch or a second switch is shorted by comparing a voltage on the input voltage bus with a first predetermined voltage reference, after passing the first short circuit testing step, in a second short circuit testing step, determining whether a first switch or a fourth switch is shorted by comparing a voltage on the common node of the third switch and the fourth switch with a second predetermined voltage reference, and after passing the second short circuit testing step, in a third short circuit testing step, determining whether a third switch is shorted by comparing the voltage on the common node of the third switch and the fourth switch with a third predetermined voltage reference.

20 Claims, 5 Drawing Sheets

Figure 5

SHORT CIRCUIT DETECTION APPARATUS AND CONTROL METHOD FOR SWITCHED CAPACITOR CONVERTER

This application claims the benefit of U.S. Provisional Application No. 63/106,669, filed on Oct. 28, 2020, entitled "Short Circuit Detection Apparatus and Control Method for Switched Capacitor Converter," which application is hereby incorporated herein by reference.

TECHNICAL FIELD

The present invention relates to a short circuit detection apparatus, and, in particular embodiments, to a short circuit detection apparatus for a switched capacitor converter.

BACKGROUND

As technologies further advance, a variety of portable devices, such as mobile phones, tablet PCs, digital cameras, MP3 players and/or the like, have become popular. Each portable device may employ at least one rechargeable battery cell.

As power consumption has become more important, there may be a need for reducing the length of time to charge the battery. Fast charging has emerged as a veritable solution to satisfy the ever changing demand from consumers. In a fast charging system, a switched capacitor converter is employed to deliver high current to the battery while keeping the input current (e.g., USB cable current) low. The switched capacitor converter has various advantages such as monolithic integration of the converter without external inductors, high power conversion efficiency and the like. The switched capacitor converter is capable of achieving a safe and quick charging of large-capacity batteries.

In the fast charging system, short circuit detection tests are essential to ensure the safety and long-term reliability of the battery and battery charging systems. The short circuit detection tests are particularly important for the switched capacitor converter because the power switches of the switched capacitor converter are typically of ultra-low resistance. The existing short circuit detection tests only cover the short circuit across the flying capacitor of the switched capacitor converter. It would be desirable to have a simple and reliable short circuit detection apparatus and method for covering the short circuit tests of all switching elements in the switched capacitor converter.

SUMMARY

These and other problems are generally solved or circumvented, and technical advantages are generally achieved, by preferred embodiments of the present disclosure which provide a short circuit detection apparatus and method for a switched capacitor converter.

In accordance with an embodiment, a method comprises connecting an input voltage bus of a switched capacitor converter to a power source through a load switch, the switched capacitor converter comprising a first switch, a second switch, a third switch and a fourth switch connected in series between the input voltage bus and ground, and a flying capacitor connected between a common node of the first switch and the second switch, and a common node of the third switch and the fourth switch, in a first short circuit testing step, determining whether the load switch or the second switch is shorted by comparing a voltage on the input voltage bus with a first predetermined voltage reference, after passing the first short circuit testing step, in a second short circuit testing step, determining whether the first switch or the fourth switch is shorted by comparing a voltage on the common node of the third switch and the fourth switch with a second predetermined voltage reference, and after passing the second short circuit testing step, in a third short circuit testing step, determining whether the third switch is shorted by comparing the voltage on the common node of the third switch and the fourth switch with a third predetermined voltage reference.

In accordance with another embodiment, a method for detecting failed components in a switched capacitor converter comprising four switches and a flying capacitor comprises in a first step, comparing a voltage on an input voltage bus of the switched capacitor converter with a first predetermined voltage reference to determine whether a load switch or a second switch of the switched capacitor converter is shorted, wherein the load switch is coupled between a power source and the input voltage bus, after passing the first step, in a second step, comparing a voltage on a common node of a third switch and a fourth switch with a second predetermined voltage reference to determine whether a first switch or a fourth switch is shorted, after passing the second step, in a third step, comparing the voltage on the common node of the third switch and the fourth switch with a third predetermined voltage reference determining whether a third switch is shorted, and after passing the third step, turning on the load switch to establish the voltage on the input voltage bus, turning on the second switch, and in a fourth step, comparing the voltage on the common node of the third switch and the fourth switch with a fourth predetermined voltage reference to determine whether the flying capacitor is shorted.

In accordance with yet another embodiment, a system comprises a switched capacitor converter comprising a first switch, a second switch, a third switch and a fourth switch connected in series between an input voltage bus and ground, and a flying capacitor connected between a common node of the first switch and the second switch, and a common node of the third switch and the fourth switch, wherein the input voltage bus is configured to be coupled to a power source through a load switch, and a short circuit detection apparatus comprising a first dedicated circuit and a second dedicated circuit, wherein the first dedicated circuit comprises a current reference and a first control switch connected in series between a common node of the second switch and the third switch, and ground, and wherein the first control switch and the fourth switch form a current mirror, and the second dedicated circuit is connected between the common node of the second switch and the third switch, and the common node of the third switch and the fourth switch, and wherein the second dedicated circuit is configured to establish a voltage on the common node of the third switch and the fourth switch to conduct a short circuit test.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a short circuit detection apparatus for a switched capacitor converter. The invention may also be applied, however, to a variety of power converters. Hereinafter, various embodiments will be explained in detail with reference to the accompanying drawings.

Figure 1:
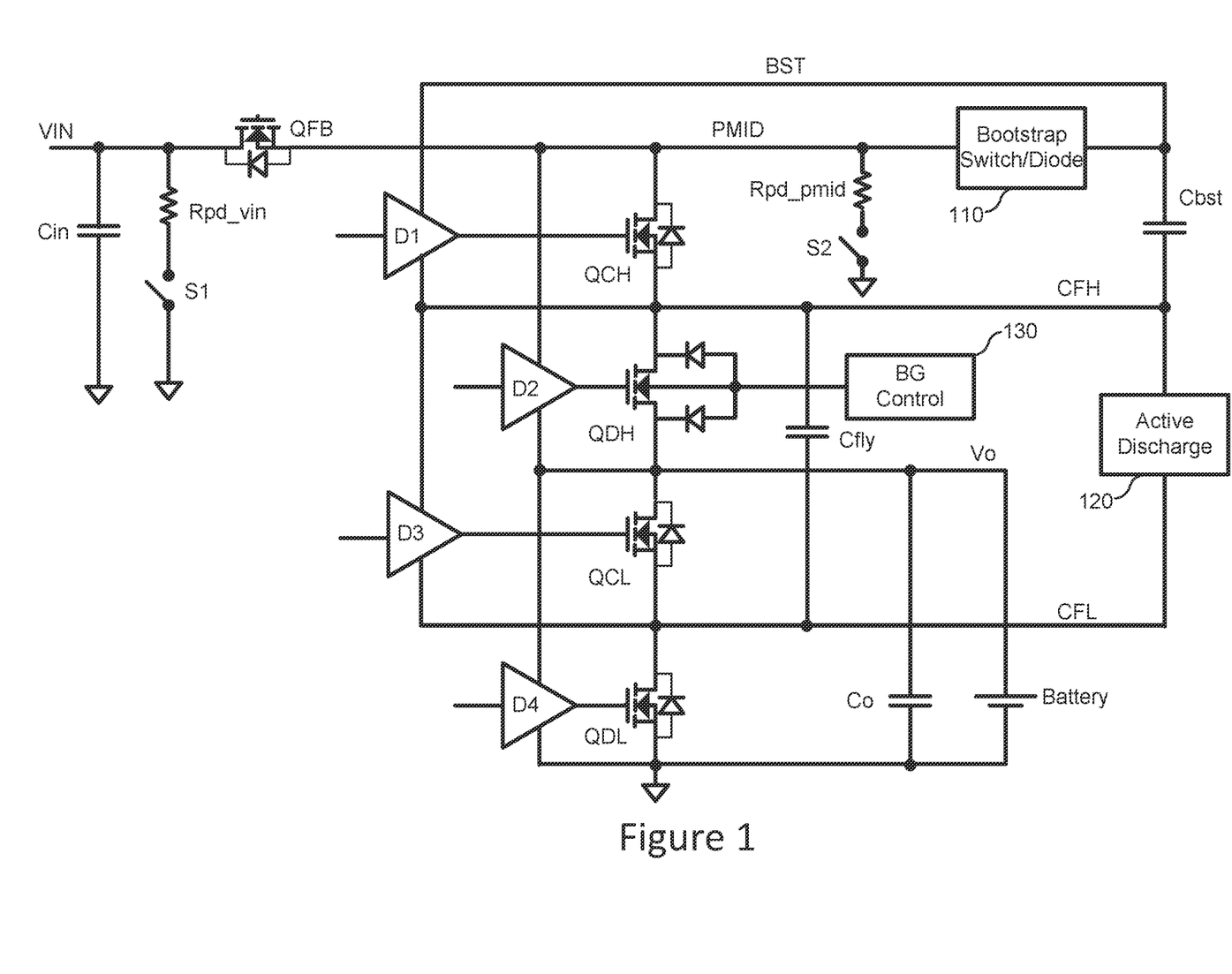
FIG. 1 illustrates a schematic diagram of a switched capacitor converter in accordance with various embodiments of the present disclosure.

FIG. 1 illustrates a schematic diagram of a switched capacitor converter in accordance with various embodiments of the present disclosure. An input voltage bus (PMID) of the switched capacitor converter is coupled to a charging source VIN through a switch QFB. An output (Vo) of the switched capacitor converter is coupled to a battery. The switch QFB may function as a load switch.

As shown in FIG. 1, an input capacitor Cin is connected between VIN and ground. An input voltage bus dissipation circuit is connected in parallel with the input capacitor Cin. The input voltage bus dissipation circuit comprises a resistor Rpd_vin and a switch 51 connected in series. A PMID dissipation circuit is connected between the input voltage bus PMID and ground. The PMID dissipation circuit comprises a resistor Rpd_pmid and a switch S2 connected in series. The PMID dissipation circuit is employed to discharge the input voltage bus PMID so that the voltage on the input voltage bus PMID is close to zero after the switched capacitor converter has been turned off. This ensures that at the beginning of the next power-up, the voltage on the input voltage bus PMID is approximately equal to zero.

As shown in FIG. 1, the switched capacitor converter comprises a first switch QCH, a second switch QDH, a third switch QCL and a fourth switch QDL connected in series between the input voltage bus PMID and ground. As shown in FIG. 1, each switch has a dedicated driver. A first driver D1 is configured to drive QCH. A second driver D2 is configured to drive QDH. A third driver D3 is configured to drive QCL. A fourth driver D4 is configured to drive QDL.

The switched capacitor converter further comprises a first capacitor Cfly, a second capacitor Cbst and a third capacitor Co. The first capacitor Cfly is connected between a common node (CFH) of switches QCH and QDH, and a common node (CFL) of switches QCL and QDL. The first capacitor Cfly may be alternatively referred to as a flying capacitor. An active discharge circuit 120 is connected in parallel with the flying capacitor Cfly. The active discharge circuit 120 is employed to discharge the voltage across the flying capacitor after the switched capacitor converter has been turned off.

The second capacitor Cbst is connected between a voltage bus BST and the node CFH. The second capacitor Cbst functions as a bootstrap capacitor. A bootstrap switch or a bootstrap diode 110 is used to charge the second capacitor Cbst. Throughout the description, Cbst may be alternatively referred to as a bootstrap capacitor.

The bootstrap capacitor Cbst is configured to provide bias power to the high-side drivers (e.g., the driver D1 for QCH). The third capacitor Co is connected between the output Vo and ground. The third capacitor Co is in parallel with the load (e.g., the battery shown in FIG. 1).

In some embodiments, the second switch QDH is implemented as an isolation switch. In particular, QDH provides isolation between the battery and the charging source VIN. As shown in FIG. 1, the bulk terminal of the second switch QDH is not connected to the source of the second switch QDH. The second switch QDH includes two body diodes. A first body diode is between the bulk terminal and the source terminal of QDH. A second body diode is between the bulk terminal and the drain terminal of QDH. These two body diodes are back-to-back connected. As a result of having the back-to-back connected body diodes, the second switch QDH functions as the isolation switch. After a turn-off signal is applied to the gate of the second switch QDH, the second switch QDH can provide isolation between the battery and the node CFH. More particularly, when the node CFH is shorted to ground, the second switch QDH prevents excessively high current from being drawn from the battery.

As shown in FIG. 1, a bulk control circuit 130 is connected to the common node of the two back-to-back connected diodes. The bulk control circuit 130 is employed to control the characteristics of the channel of the second switch QDH through adjusting the voltage potential at the bulk terminal of QDH. During the short circuit detection test, the body terminal of the switch is tied to ground through the bulk control circuit 130. Under this configuration, QDH functions as a bi-directional isolation switch.

In accordance with an embodiment, the switching elements of FIG. 1 may be metal oxide semiconductor field-effect transistor (MOSFET) devices. Alternatively, the switching element can be any controllable switches such as insulated gate bipolar transistor (IGBT) devices, integrated gate commutated thyristor (IGCT) devices, gate turn-off thyristor (GTO) devices, silicon controlled rectifier (SCR)

devices, junction gate field-effect transistor (JFET) devices, MOS controlled thyristor (MCT) devices, gallium nitride (GaN) based power devices, silicon carbide (SiC) based power devices and the like.

It should be noted while FIG. 1 shows the switches QCH, QDH, QCL and QDL are implemented as single n-type transistors, a person skilled in the art would recognize there may be many variations, modifications and alternatives. For example, depending on different applications and design needs, all or at least some of the switches QCH, QDH, QCL and QDL may be implemented as p-type transistors. Furthermore, each switch shown in FIG. 1 may be implemented as a plurality of switches connected in parallel. Moreover, a capacitor may be connected in parallel with one switch to achieve zero voltage switching (ZVS)/zero current switching (ZCS).

In operation, the switched capacitor converter operates in two different phases. In a first phase, the switches QCH and QCL are turned on and switches QDH and QDL are turned off. As a result of turning on QCH and QCL, the input power source VIN charges the flying capacitor Cfly and the output capacitor Co. In the first phase, the flying capacitor Cfly and the output capacitor Co are connected in series. In a second phase, the switches QDH and QDL are turned on and switches QCH and QCL are turned off. As a result of turning on QDH and QDL, the flying capacitor Cfly is connected in parallel with the output capacitor Co, and the energy stored in the flying capacitor Cfly and the output capacitor Co is discharged to the load (e.g., the battery shown in FIG. 1).

Figure 2:
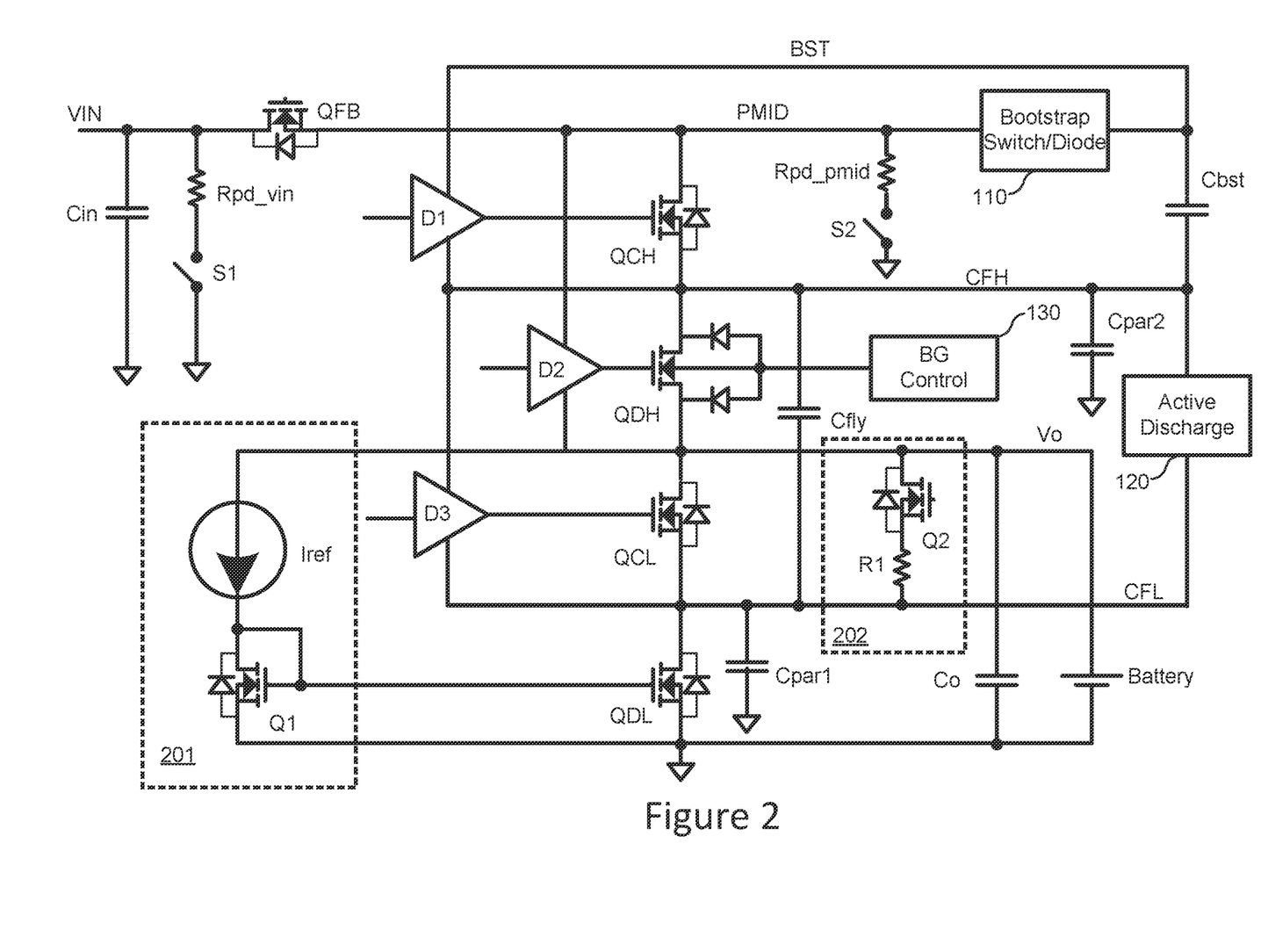
FIG. 2 illustrates a short circuit detection apparatus in accordance with various embodiments of the present disclosure.

FIG. 2 illustrates a short circuit detection apparatus in accordance with various embodiments of the present disclosure. The short circuit detection apparatus is employed to determine whether the switches and the flying capacitor of the switched capacitor converter are shorted. In some embodiments, the short circuit detection apparatus determines whether the drain terminal and/or the source terminal of the switch are shorted. As shown in FIG. 2, the short-circuit detection apparatus comprises a first dedicated circuit 201 and a second dedicated circuit 202.

The first dedicated circuit 201 comprises a reference current source Iref and a switch Q1. The switch and QDL form a current mirror. As shown in FIG. 2, the reference current source Iref is connected between Vo and the drain of the switch Q1. The ratio of the current flowing through the switch to the current flowing through QDL is equal to 1:M. M is a predetermined number.

The second dedicated circuit comprises a switch Q2 and a resistor R1. As shown in FIGS. 2, Q2 and R1 are connected in series between Vo and CFL.

In operation, prior to powering up the switched capacitor converter, a four-step short circuit detection method is applied to the switched capacitor converter. In a first step, a control circuit (e.g., control circuit 301 shown in FIG. 3) determines whether QFB or QDH is shorted. Before turning on any power switch, the control circuit is employed to check if the voltage on the input voltage bus PMID is expectedly low. The voltage on the input voltage bus PMID indicates whether QFB or QDH is shorted. In normal operation, before turning on any power switch of the switched capacitor converter, VIN is not applied to the input voltage bus PMID because QFB is turned off. In addition, the voltage of the battery is not applied to the input voltage bus PMID because QDH is an isolation switch and QDH is turned off. The voltage on the input voltage bus PMID remains low because prior to powering up the switched capacitor converter, the resistor Ppd_pmid pulls down the input voltage bus PMID to a level approximately equal to zero after the switch S2 has been turned on.

Figure 3:
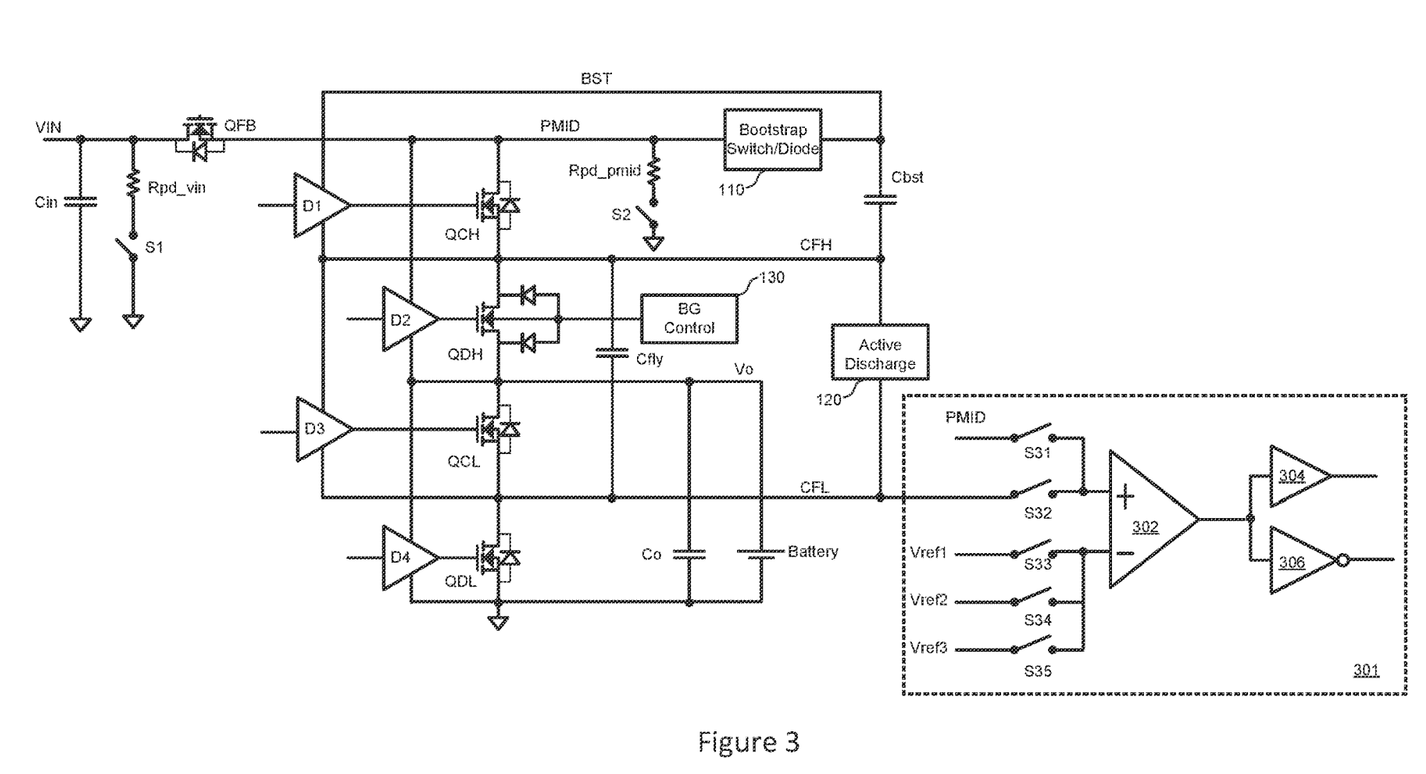
FIG. 3 illustrates a short circuit processing apparatus in accordance with various embodiments of the present disclosure.

In the first step, if the control circuit detects the voltage on the input voltage bus PMID is higher than a certain preset voltage, referred to as Vref1 in FIG. 3 (e.g., Vref1=0.5V), then there is a short either across QFB or QDH. The switched capacitor converter stops powering up. Otherwise, the testing result indicates neither QFB nor QDH is shorted. The control circuit proceeds to a second step of the short circuit test.

In the second step, the control circuit determines whether QDL or QCH is shorted. First, the first dedicated circuit 201 is turned on to drive the voltage across QDL (voltage on the node CFL) toward 0 V. In particular, Q1 and QDL form a current mirror. After the first dedicated circuit 201 has been turned on, a reference current Iref flows through Q1. The ratio of the current flowing through the switch Q1 to the current flowing through QDL is equal to 1:M. As such, a current equal to M×Iref flows through QDL. This current drives the voltage on the CFL node toward 0 V.

It should be noted that if QCL or QDH is shorted, the first dedicated circuit 201 may be not able to drive the voltage on the node CFL toward 0 V. This, however, does not have an impact on this short circuit detection test.

Second, the second dedicated circuit 202 is turned on to drive up the voltage on the node CFL with a limited current to a designed voltage level V1 for a calculated time t1. It should be noted that the charging voltage/current comes from the battery coupled to Vo. After t1, the control circuit checks if the voltage on the node CFL is higher than a predetermined reference voltage level Vref2 (shown in FIG. 3). If the voltage on the node CFL is higher than Vref2, it indicates neither QDL nor QCH is shorted. The control circuit proceeds to a third step of the short circuit test.

In the second step, the first dedicated circuit 201 is used to drive the voltage on the node CFL toward 0 V for a limited period t0. This limited period t0 can be expressed as:

$$t0 = (Cpar1 + Cpar2) \times Vo / Ilim \qquad (1)$$

In Equation (i), Cpar1 is the total parasitic capacitance seen from CFL to AC grounds. In calculating Cpar1, all DC sources are considered as AC grounds. (e.g., the GND node and the Vo node). Cpar2 is the total parasitic capacitance seen from CFH to AC grounds. Vo is the maximum battery voltage allowed in this system. Ilim is the current limit value of QDL. For example, in some embodiments, Cpar1 is equal to 500 pF. Cpar2 is equal to 500 pF. Vo is equal to 4.6 V. Ilim is equal to 1 mA. According to Equation (1), t0 is about 5 microseconds. In a real application, t0 may be set to a value greater than the calculated value due to the settling time of the gate voltage of QDL.

It should be noted that the node CFH is not directly connected to the node CFL. The flying capacitor Cfly is connected between CFH and CFL. The capacitance of Cfly is much greater than the parasitic capacitance (e.g., the capacitance of Cpar2). In the AC analysis, Cfly provides a low impedance path between CFH and CFL. As such, the total parasitic capacitance seen from CFH to AC grounds should be combined with the total parasitic capacitance seen from CFL to AC grounds in Equation (1).

It should be noted there may be various implementations of the second dedicated circuit 202. The various implementations fall into two main categories. In a first category, a circuit charges the node CFL up to a preset voltage V1 through a resistor R1. In a second category, a circuit uses a fixed current to charge the nod e CFL up to a preset voltage V1.

For the first category of the various implementations of the second dedicated circuit 202 (shown in FIG. 2), the minimum period for the second dedicated circuit 202 to be turned on is $t1_{min1}$. In some embodiments, $t1_{min1}$ can be expressed by the following equation:

$$t1_{min1} = \tau \times \ln\left[\frac{V1}{V1 - Vref2}\right] \quad (2)$$

In Equation (2), $\tau$ is the time constant governed approximately by $R1 \times (Cpar1 + Cpar2)$. For example, R1 is equal to 100 kilo-ohms. Cpar1 is equal to 500 pF, and Cpar2 is equal to 500 pF. Accordingly, r is equal to 100 us. In some embodiments, V1 is equal to 0.5 V, and Vref2 is equal to 0.2 V. According to Equation (2), $t1_{min1}$ is approximately equal to 51 microseconds. In a real application, a margin may be added to $t1_{min1}$. For example, $t1_{min1}$ may be equal to 100 microseconds.

For the second category of the various implementations of the second dedicated circuit 202, the minimum period for the second dedicated circuit to be turned on is equal to $t1_{min2}$. In some embodiments, $t1_{min2}$ can be expressed by the following equation:

$$t1_{min2} = (Cpar1 + Cpar2) \times Vref2 / I\_fix \quad (3)$$

In Equation (3), I_fix is the fixed current used to charge the node CFL up to the preset voltage V1. It should be noted that, in a real application, a margin may also be added to $t1_{min2}$ of Equation (3).

The upper limit of t1 is determined such that the second dedicated circuit 202 is not able to charge the flying capacitor Cfly up to Vref2. This principle gives the maximum allowed value of t1. For the first category of the various implementations of the second dedicated circuit 202, the maximum allowed value of t1 can be expressed by the following equation:

$$t1_{max1} = R1 \times Cfly \times \ln\left[\frac{V1}{V1 - Verf2}\right] \quad (4)$$

For the second category of the various implementations of the second dedicated circuit, the maximum allowed value of t1 can be expressed by the following equation:

$$t1_{max2} = Cfly \times Vref2 / I\_fix \quad (5)$$

In operation, the second dedicated circuit 202 drives up the voltage on the node CFL with a limited current to a designed voltage level V1 for the calculated time t1. After t1, the control circuit checks if the voltage on the node CFL is higher than a predetermined reference voltage level Vref2. If the voltage on the node CFL is higher than Vref2, it indicates neither QDL nor QCH is shorted. Otherwise, at least one of QDL or QCH's drain and/or source is shorted. After passing the second step, the control circuit proceeds to a third step of the short circuit test.

In the third step, the control circuit determines whether QCL is shorted. The first dedicated circuit 201 is turned on to drive the voltage across QDL (the voltage on the node CFL) down with a limited current Ilim for a calculated time t2. On expiration of this time (t2), the control circuit checks if the voltage on the node CFL is lower than a calculated reference voltage level Vref3 (shown in FIG. 3). If the voltage on the node CFL is lower than Vref3, it indicates QCL is not shorted. The control circuit proceeds to the fourth step.

The minimum value for t2 is given by the following equation:

$$t2 = (Cpar1 + Cpar2) \times (V1 - Vref3) / Ilim \quad (6)$$

In some embodiments, Cpar1 is equal to 500 pF, and Cpar2 is equal to 500 pF. V1 is equal to 0.5V, and Vref3 is equal to 0.1V. According to Equation (6), the minimum value of t2 is equal to 0.4 microseconds. In a real application, a margin may be added to t2 to account for the gate settling time of QDL.

In some embodiments, the maximum allowed value for t2 is given by the following equation:

$$t2 = Cfly \times (V1 - Vref3) / Ilim \quad (7)$$

In the fourth step, the control circuit determines whether Cfly is shorted. After QFB is turned on, and the voltage on the input voltage bus PMID is ramped up to VIN, QDH is turned on. The turned-on QDH connects CFH to Vo. With a current limit, QDL drives CFL down so as to pre-charge Cfly to a voltage level equal to Vo. If there is a short across Cfly, CFL cannot be driven down to 0V by QDL. After a calculated time t3, the control circuit checks if the voltage on the node CFL is less than a predetermined level Vref3. In some embodiments, Vref3 is close to 0V. If the voltage on the node CFL is less than Vref3, it indicates there is no short across Cfly. The control circuit can proceed with powering up the switched capacitor converter.

It should be noted that the active discharge circuit 120 shown in FIG. 2 is disabled during the short circuit detection process described above. In other words, the active discharge circuit 120 is equivalent to open circuit during the short circuit detection process.

FIG. 3 illustrates a short circuit processing apparatus in accordance with various embodiments of the present disclosure. A control circuit 301 comprises a comparator 302, a buffer 304 and an inverter 306. In the discussion above with respect to FIG. 2, Vref1, Vref2 and Vref3 are used as references to determine whether a switch or the flying capacitor is shorted. As shown in FIG. 3, a single comparator 302 with its positive and negative inputs being multiplexed to be the according signals needed in different detection steps described above with respect to FIG. 2. As shown in FIG. 3, the positive input of the comparator 302 is connected to the input voltage bus PMID and CFL through switches S31 and S32, respectively. The negative input of the comparator 302 is connected to Vref1, Vref2 and Vref3 through switches S33, S34 and S35, respectively. The output of the comparator 302 is fed into an input of a buffer 304 and an input of an inverter 306. The outputs of the buffer 304 and the inverter 306 are used to determine whether the switches and the flying capacitor of the switched capacitor converter are shorted.

Figure 4:
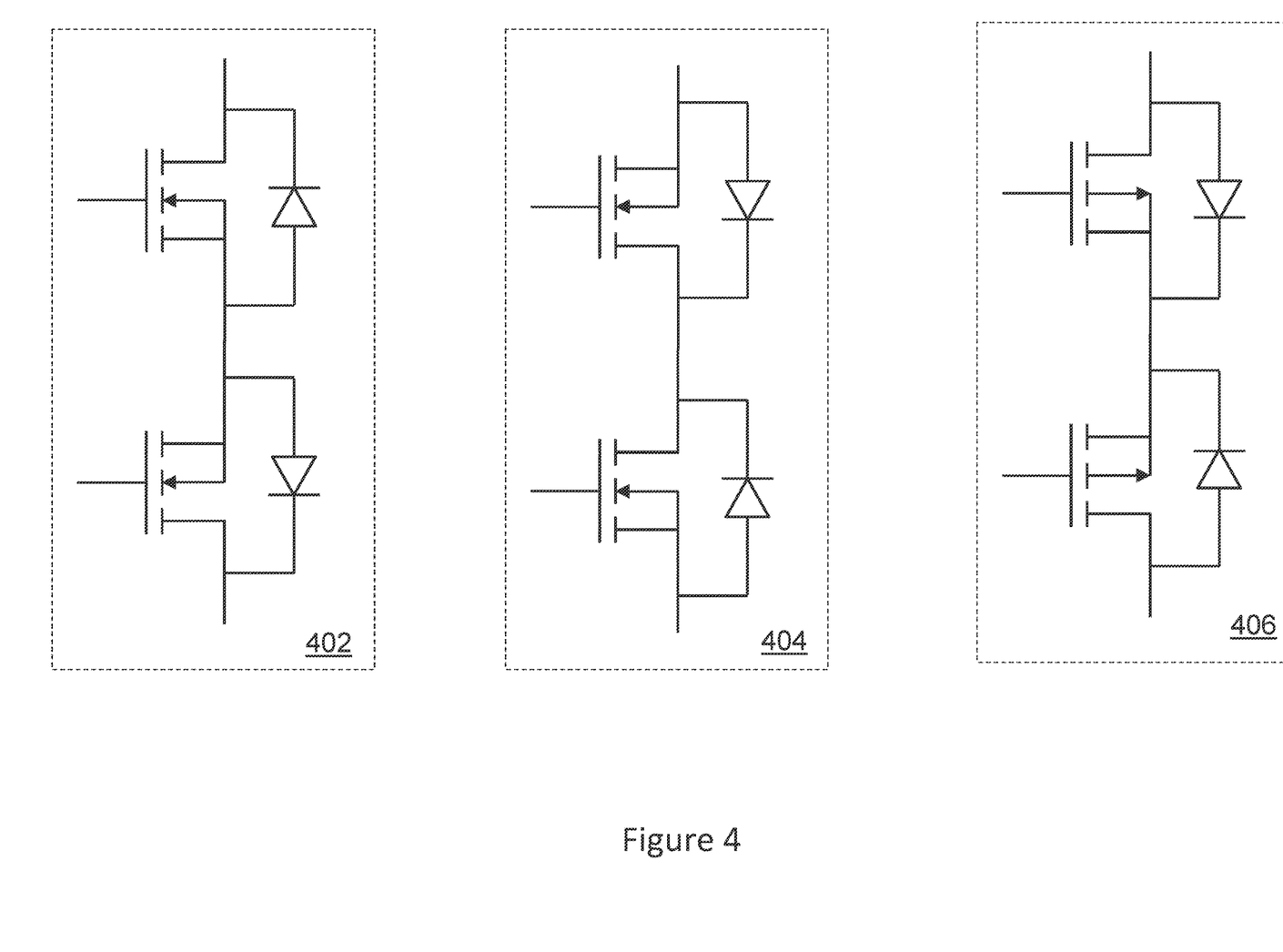
FIG. 4 illustrates three back-to-back connected transistors in accordance with various embodiments of the present disclosure.

FIG. 4 illustrates three back-to-back connected transistors in accordance with various embodiments of the present disclosure. A first dashed box 402 includes back-to-back connected n-type transistors. The drains of these two n-type transistors are directly connected to each other. The back-to-back connected n-type transistors in box 402 can be used to replace the switch QDH shown in FIG. 1-3 above. This replacement is fully intended to be included within the scope of the embodiments discussed herein.

A second dashed box 404 includes back-to-back connected n-type transistors. The sources of these two n-type transistors are directly connected to each other. The backto-back connected n-type transistors in box 404 can be used to replace the switch QDH shown in FIG. 1-3 above. This replacement is fully intended to be included within the scope of the embodiments discussed herein.

A third dashed box 406 includes back-to-back connected p-type transistors. The back-to-back connected p-type transistors in box 406 can be used to replace the switch QDH shown in FIG. 1-3 above. This replacement is fully intended to be included within the scope of the embodiments discussed herein.

It should be noted that the embodiments discussed above with respect to FIGS. 1-4 are based on a single phase switched capacitor converter. The embodiments discussed above (the short circuit detection method) can be extended to multiple-phase switched capacitor converters as each phase can be independently checked according to the method described above.

Figure 5:
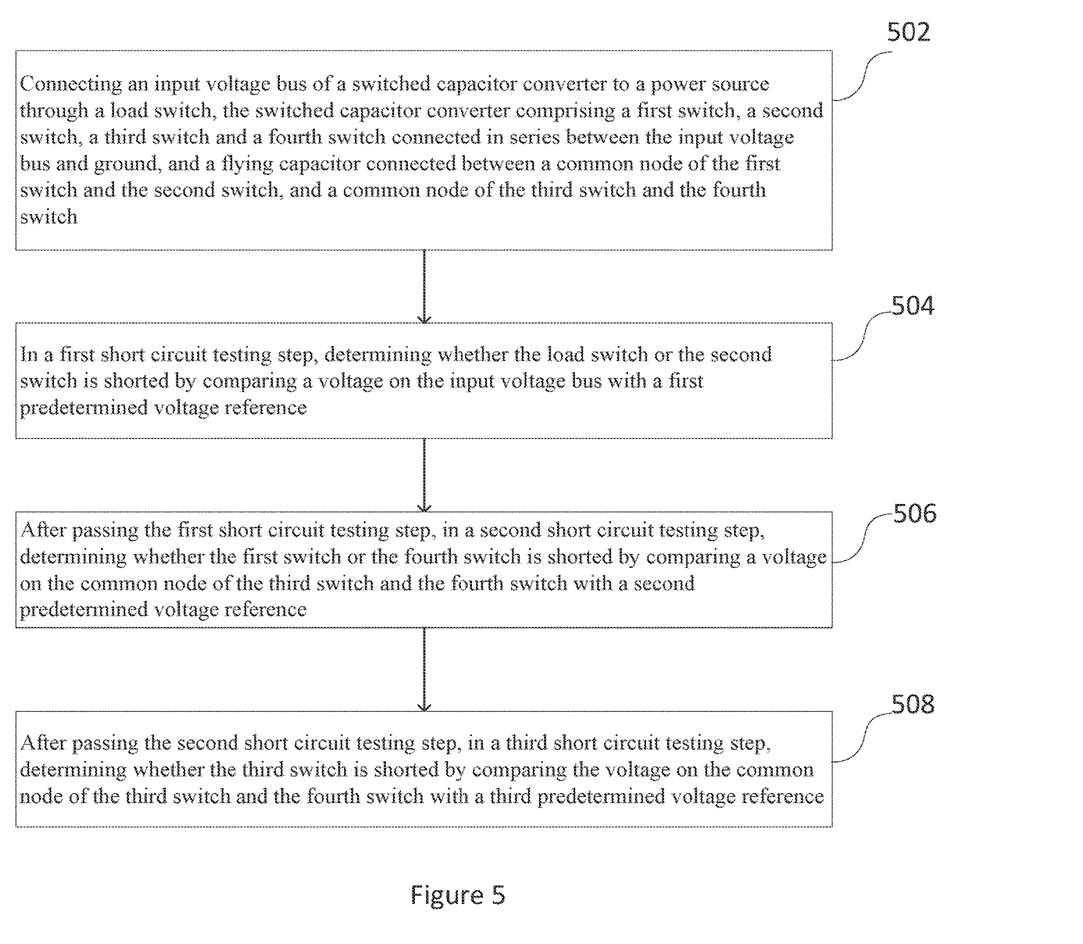
FIG. 5 illustrates a flow chart of a short circuit detection method for the switched capacitor converter shown in FIG. 1 in accordance with various embodiments of the present disclosure.

FIG. 5 illustrates a flow chart of a short circuit detection method for the switched capacitor converter shown in FIG. 1 in accordance with various embodiments of the present disclosure. This flowchart shown in FIG. 5 is merely an example, which should not unduly limit the scope of the claims. One of ordinary skill in the art would recognize many variations, alternatives, and modifications. For example, various steps illustrated in FIG. 5 may be added, removed, replaced, rearranged and repeated.

At step 502, an input voltage bus of a switched capacitor converter is connected to a power source through a load switch. The output of the switched capacitor converter is connected to a load such as a battery. The switched capacitor converter comprises a first switch, a second switch, a third switch and a fourth switch connected in series between the input voltage bus and ground, and a flying capacitor connected between a common node of the first switch and the second switch, and a common node of the third switch and the fourth switch.

At step 504, in a first short circuit testing step, a control circuit determines whether the load switch or the second switch is shorted by comparing a voltage on the input voltage bus with a first predetermined voltage reference.

At step 506, after passing the first short circuit testing step, in a first short circuit testing step, the control circuit determines whether the first switch or the fourth switch is shorted by comparing the voltage on the common node of the third switch and the fourth switch with a second predetermined voltage reference.

At step 508, after passing the second short circuit testing step, in a third short circuit testing step, the control circuit determines whether the third switch is shorted by comparing the voltage on the common node of the third switch and the fourth switch with a third predetermined voltage reference.

The method further comprises after passing the third short circuit testing step, turning on the load switch to establish the voltage on the input voltage bus, turning on the second switch, and in a fourth short circuit testing step, determining whether the flying capacitor is shorted by comparing the voltage on the common node of the third switch and the fourth switch with a fourth predetermined voltage reference.

The method further comprises discharging the voltage on the common node of the third switch and the fourth switch with a predetermined current, and after a predetermined time, comparing the voltage on the common node of the third switch and the fourth switch with the fourth predetermined voltage reference to determine whether the flying capacitor is shorted.

The method further comprises discharging the input voltage bus using a resistor and a switch coupled between the input voltage bus and ground after the switched capacitor converter has been turned off, and during the first short circuit testing step, after turning off the load switch, comparing the voltage on the input voltage bus with the first predetermined voltage reference to determine whether the load switch or the second switch is shorted.

The method further comprises in the second short circuit testing step, driving a voltage across the fourth switch toward zero volts for a predetermined time using a current mirror, charging the voltage on the common node of the third switch and the fourth switch with a predetermined current, and after a predetermined time, comparing the voltage on the common node of the third switch and the fourth switch with the second predetermined voltage reference to determine whether the first switch or the fourth switch is shorted.

The method further comprises in the third short circuit testing step, driving a voltage across the fourth switch toward zero volts for a predetermined time with a predetermined current, and comparing the voltage on the common node of the third switch and the fourth switch with the third predetermined voltage reference to determine whether the third switch is shorted.

With respect to a first step of a short circuit detection method, the method further comprises discharging the input voltage bus using a resistor and a switch coupled between the input voltage bus and ground after the switched capacitor converter has been turned off, and in the first step, maintaining the load switch in a non-conducting state, and determining at least one of the load switch and the second switch is shorted when the voltage on the input voltage bus is higher than the first predetermined voltage reference.

With respect to a second step of the short circuit detection method, the method further comprises in the second step, driving a voltage across the fourth switch toward zero volts for a first predetermined time using a current mirror, charging the voltage on the common node of the third switch and the fourth switch with a second predetermined current, and after a second predetermined time, determining at least one of the first switch and the fourth switch is shorted when the voltage on the common node of the third switch and the fourth switch is less than the second predetermined voltage reference.

With respect to a third step of the short circuit detection method, the method further comprises in the third step, driving a voltage across the fourth switch toward zero volts for a predetermined time with a predetermined current, and determining the third switch is shorted when the voltage on the common node of the third switch and the fourth switch is higher than the third predetermined voltage reference.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
connecting an input voltage bus of a switched capacitor converter to a power source through a load switch, the switched capacitor converter comprising a first switch, a second switch, a third switch and a fourth switch connected in series between the input voltage bus and ground, and a flying capacitor connected between a common node of the first switch and the second switch, and a common node of the third switch and the fourth switch, wherein the switched capacitor converter is configured to charge a battery coupled to an output of the switched capacitor converter;
in a first short circuit testing step, determining whether the load switch or the second switch is shorted by comparing a voltage on the input voltage bus with a first predetermined voltage reference;
after passing the first short circuit testing step, in a second short circuit testing step, determining whether the first switch or the fourth switch is shorted by comparing a voltage on the common node of the third switch and the fourth switch with a second predetermined voltage reference; and
after passing the second short circuit testing step, in a third short circuit testing step, determining whether the third switch is shorted by comparing the voltage on the common node of the third switch and the fourth switch with a third predetermined voltage reference.

2. The method of claim 1, further comprising:
after passing the third short circuit testing step, turning on the load switch to establish the voltage on the input voltage bus;
turning on the second switch; and
in a fourth short circuit testing step, determining whether the flying capacitor is shorted by comparing the voltage on the common node of the third switch and the fourth switch with a fourth predetermined voltage reference.

3. The method of claim 2, further comprising:
discharging the voltage on the common node of the third switch and the fourth switch with a predetermined current; and
after a predetermined time, comparing the voltage on the common node of the third switch and the fourth switch with the fourth predetermined voltage reference to determine whether the flying capacitor is shorted.

4. The method of claim 1, further comprising:
discharging the input voltage bus using a resistor and a switch coupled between the input voltage bus and ground after the switched capacitor converter has been turned off; and
during the first short circuit testing step, after turning off the load switch, comparing the voltage on the input voltage bus with the first predetermined voltage reference to determine whether the load switch or the second switch is shorted.

5. The method of claim 1, further comprising:
in the second short circuit testing step, driving a voltage across the fourth switch toward zero volts for a predetermined time using a current mirror;
charging the voltage on the common node of the third switch and the fourth switch with a predetermined current; and
after a predetermined time, comparing the voltage on the common node of the third switch and the fourth switch with the second predetermined voltage reference to determine whether the first switch or the fourth switch is shorted.

6. The method of claim 1, further comprising:
in the third short circuit testing step, driving a voltage across the fourth switch toward zero volts for a predetermined time with a predetermined current; and
comparing the voltage on the common node of the third switch and the fourth switch with the third predetermined voltage reference to determine whether the third switch is shorted.

7. The method of claim 1, wherein:
the second switch comprises a first diode connected between a drain and a bulk terminal of the second switch, and a second diode connected between a source and the bulk terminal of the second switch, and wherein the first diode and the second diode are back-to-back connected.

8. The method of claim 7, further comprising:
controlling characteristics of a channel of the second switch through adjusting a voltage potential at the bulk terminal of the second switch.

9. A method for detecting failed components in a switched capacitor converter comprising four switches and a flying capacitor, the method comprising:
in a first step, comparing a voltage on an input voltage bus of the switched capacitor converter with a first predetermined voltage reference to determine whether a load switch or a second switch of the switched capacitor converter is shorted, wherein the load switch is coupled between a power source and the input voltage bus;
after passing the first step, in a second step, comparing a voltage on a common node of a third switch and a fourth switch with a second predetermined voltage reference to determine whether a first switch or a fourth switch is shorted;
after passing the second step, in a third step, comparing the voltage on the common node of the third switch and the fourth switch with a third predetermined voltage reference determining whether a third switch is shorted; and
after passing the third step, turning on the load switch to establish the voltage on the input voltage bus, turning on the second switch, and in a fourth step, comparing the voltage on the common node of the third switch and the fourth switch with a fourth predetermined voltage reference to determine whether the flying capacitor is shorted.

10. The method of claim 9, wherein:
prior to comparing the voltage on the common node of the third switch and the fourth switch with the fourth predetermined voltage reference, the voltage on the common node of the third switch and the fourth switch is discharged by a predetermined current for a predetermined time.

11. The method of claim 9, wherein the switched capacitor converter comprises:
the first switch, the second switch, the third switch and the fourth switch connected in series between the input voltage bus and ground; and
the flying capacitor connected between a common node of the first switch and the second switch, and a common node of the third switch and the fourth switch.

12. The method of claim 9, further comprising:
discharging the input voltage bus using a resistor and a switch coupled between the input voltage bus and ground after the switched capacitor converter has been turned off; and
in the first step, maintaining the load switch in a non-conducting state, and determining at least one of the load switch and the second switch is shorted when the voltage on the input voltage bus is higher than the first predetermined voltage reference.

13. The method of claim 9, further comprising:
in the second step, driving a voltage across the fourth switch toward zero volts for a first predetermined time using a current mirror;
charging the voltage on the common node of the third switch and the fourth switch with a second predetermined current; and
after a second predetermined time, determining at least one of the first switch and the fourth switch is shorted when the voltage on the common node of the third switch and the fourth switch is less than the second predetermined voltage reference.

14. The method of claim 9, further comprising:
in the third step, driving a voltage across the fourth switch toward zero volts for a predetermined time with a predetermined current; and
determining the third switch is shorted when the voltage on the common node of the third switch and the fourth switch is higher than the third predetermined voltage reference.

15. A system comprising:
a switched capacitor converter comprising a first switch, a second switch, a third switch and a fourth switch connected in series between an input voltage bus and ground, and a flying capacitor connected between a common node of the first switch and the second switch, and a common node of the third switch and the fourth switch, wherein the input voltage bus is configured to be coupled to a power source through a load switch, and the switched capacitor converter is configured to charge a battery coupled to an output of the switched capacitor converter; and
a short circuit detection apparatus comprising a first dedicated circuit and a second dedicated circuit, wherein:
the first dedicated circuit comprises a current reference and a first control switch connected in series between a common node of the second switch and the third switch, and ground, and wherein the first control switch and the fourth switch form a current mirror; and
the second dedicated circuit is connected between the common node of the second switch and the third switch, and the common node of the third switch and the fourth switch, and wherein the second dedicated circuit is configured to establish a voltage on the common node of the third switch and the fourth switch to conduct a short circuit test.

16. The system of claim 15, wherein:
the second dedicated circuit comprises a second control switch and a resistor connected in series.

17. The system of claim 15, wherein:
the second switch comprises a first diode connected between a drain and a bulk terminal of the second switch, and a second diode connected between a source and the bulk terminal of the second switch, and wherein the first diode and the second diode are back-to-back connected, and wherein characteristics of a channel of the second switch is controlled through adjusting a voltage potential at the bulk terminal of the second switch.

18. The system of claim 15, wherein:
the input voltage bus is discharged using a resistor and a switch coupled between the input voltage bus and ground after the switched capacitor converter has been turned off; and
in a first step of the short circuit test, the load switch is in a non-conducting state, and at least one of the load switch and the second switch is determined to be shorted when a voltage on the input voltage bus is higher than a first predetermined voltage reference.

19. The system of claim 15, wherein:
in a second step of the short circuit test, a voltage across the fourth switch is driven toward zero volts using a current mirror formed by the first dedicated circuit and the fourth switch;
the second dedicated circuit is configured to establish the voltage on the common node of the third switch and the fourth switch; and
at least one of the first switch and the fourth switch is determined to be shorted when the voltage on the common node of the third switch and the fourth switch is less than a second predetermined voltage reference.

20. The system of claim 15, wherein:
in a third step of the short circuit test, a voltage across the fourth switch is driven toward zero volts using a current mirror formed by the first dedicated circuit and the fourth switch; and
the third switch is determined to be shorted when the voltage on the common node of the third switch and the fourth switch is higher than a third predetermined voltage reference.

* * * * *